United States Patent
Lin et al.

(10) Patent No.: US 10,341,623 B2
(45) Date of Patent: Jul. 2, 2019

(54) OPTICAL PROJECTION SYSTEM AND ENERGY CONTROL METHOD THEREFOR USING SELECTION UNIT

(71) Applicants: Chien-Hsu Lin, Hsin-Chu (TW); Jui-Ta Liu, Hsin-Chu (TW)

(72) Inventors: Chien-Hsu Lin, Hsin-Chu (TW); Jui-Ta Liu, Hsin-Chu (TW)

(73) Assignee: Coretronic Corporation, Hsin-Chu (TW)

(*) Notice: Subject to any disclaimer, the term of this patent is extended or adjusted under 35 U.S.C. 154(b) by 0 days.

(21) Appl. No.: 14/606,815

(22) Filed: Jan. 27, 2015

(65) Prior Publication Data
US 2015/0319397 A1    Nov. 5, 2015

(30) Foreign Application Priority Data

Apr. 30, 2014 (TW) .............................. 103115464 A (51) Int. Cl.
H04N 9/31 (2006.01)
H04N 5/74 (2006.01)
(Continued)

(52) U.S. Cl.
CPC ........... *H04N 9/3144* (2013.01); *G03B 21/16* (2013.01); *H01L 35/00* (2013.01); *H04N 5/7416* (2013.01); *H04N 9/3141* (2013.01)

(58) Field of Classification Search
CPC .... G03B 21/16; H04N 9/3144; H04N 9/3141; G09G 2330/021; G09G 2330/022;
(Continued)

(56) References Cited

U.S. PATENT DOCUMENTS 5,281,985 A * 1/1994 Chan ...................... G09F 21/04
                                                    348/744
6,588,907 B1 * 7/2003 Billington ............... G03B 21/16
                                                    348/748
(Continued)

FOREIGN PATENT DOCUMENTS

JP   2004312991 A   11/2004
TW    200643597 A   12/2005

OTHER PUBLICATIONS

Taiwanese Office Action in application No. 103115464 dated Oct. 22, 2015; pp. 1-6.

*Primary Examiner* — Bao-Luan Q Le
(74) *Attorney, Agent, or Firm* — Muchy, Geissler, Olds & Lowe, P.C.

(57) ABSTRACT

An optical projection system includes a light source module, an optical engine, a thermoelectric generator, a storage unit, a plurality of electronic devices, and a selection unit. The light source module is capable of emitting at least one light beam, and the optical engine receives the light beam and modulates the light beam according to at least one image signal to form an image beam. The thermoelectric generator absorbs heat in the optical projection system and converts the heat into electrical energy, and the storage unit stores the electrical energy. The electronic devices receive the electrical energy stored in the storage unit and have at least two different threshold voltages. The selection unit selectively turns on at least one of electronic devices according to a state of charge of the storage unit.

16 Claims, 5 Drawing Sheets

(51) Int. Cl.
*G03B 21/16* (2006.01)
*H01L 35/00* (2006.01)

(58) Field of Classification Search
CPC .... G06F 1/3203; G06F 1/3215; G06F 1/3265; G06F 1/3287; H04W 52/0261; Y02D 10/171
See application file for complete search history.

(56) References Cited

U.S. PATENT DOCUMENTS

| | | | | |
|---|---|---|---|---|
| 7,348,737 B2* | 3/2008 | Fujii | ............... | H05B 41/2923 315/209 R |
| 7,926,953 B2* | 4/2011 | Yanagisawa | ......... | H04N 9/3144 352/202 |
| 7,938,548 B2* | 5/2011 | Nozaki | ............... | G03B 21/28 315/219 |
| 8,220,930 B2* | 7/2012 | Tang | ............... | G01J 1/04 136/256 |
| 8,725,219 B2* | 5/2014 | Patino | ............... | H04W 52/0277 455/127.5 |
| 2005/0000559 A1* | 1/2005 | Horio | ............... | H01L 35/30 136/205 |
| 2005/0088626 A1* | 4/2005 | Huang | ............... | G03B 21/14 353/43 |
| 2006/0023449 A1* | 2/2006 | Lee | ............... | G02B 5/04 362/231 |
| 2007/0024204 A1* | 2/2007 | Fujii | ............... | H05B 41/2923 315/209 R |
| 2007/0289621 A1* | 12/2007 | Horio | ............... | F21S 48/328 136/205 |
| 2007/0291238 A1* | 12/2007 | Yanagisawa | ............... | G03B 21/16 353/119 |
| 2008/0036975 A1* | 2/2008 | Yang | ............... | G03B 21/16 353/57 |
| 2009/0033888 A1* | 2/2009 | Nozaki | ............... | G03B 21/14 353/119 |
| 2009/0036158 A1* | 2/2009 | Fujinawa | ............... | G03B 17/54 455/556.1 |
| 2009/0067275 A1* | 3/2009 | Yasuda | ............... | H04N 5/63 365/228 |
| 2009/0141245 A1* | 6/2009 | Nozaki | ............... | G03B 21/28 353/56 |
| 2009/0244488 A1* | 10/2009 | Tang | ............... | G01J 1/04 353/20 |
| 2010/0052926 A1* | 3/2010 | Oku | ............... | G03B 21/14 340/636.1 |
| 2010/0265473 A1* | 10/2010 | Yamashita | ............... | G02B 26/105 353/85 |
| 2010/0283582 A1* | 11/2010 | Fujita | ............... | H04N 1/00236 340/7.37 |
| 2010/0289915 A1* | 11/2010 | Wang | ............... | G06K 7/14 348/222.1 |
| 2010/0301774 A1 | 12/2010 | Chemel et al. | | |
| 2011/0007224 A1* | 1/2011 | Yu | ............... | G03B 21/00 348/730 |
| 2011/0211177 A1* | 9/2011 | Lee | ............... | G03B 21/14 353/119 |
| 2013/0215156 A1* | 8/2013 | Li | ............... | G03B 21/14 345/690 |
| 2013/0273964 A1* | 10/2013 | Patino | ............... | H04W 52/0277 455/552.1 |

* cited by examiner

OPTICAL PROJECTION SYSTEM AND ENERGY CONTROL METHOD THEREFOR USING SELECTION UNIT

BACKGROUND OF THE INVENTION a. Field of the Invention

The invention relates to an optical projection system and an energy control method for the optical projection system.

b. Description of the Related Art

Figure 1:
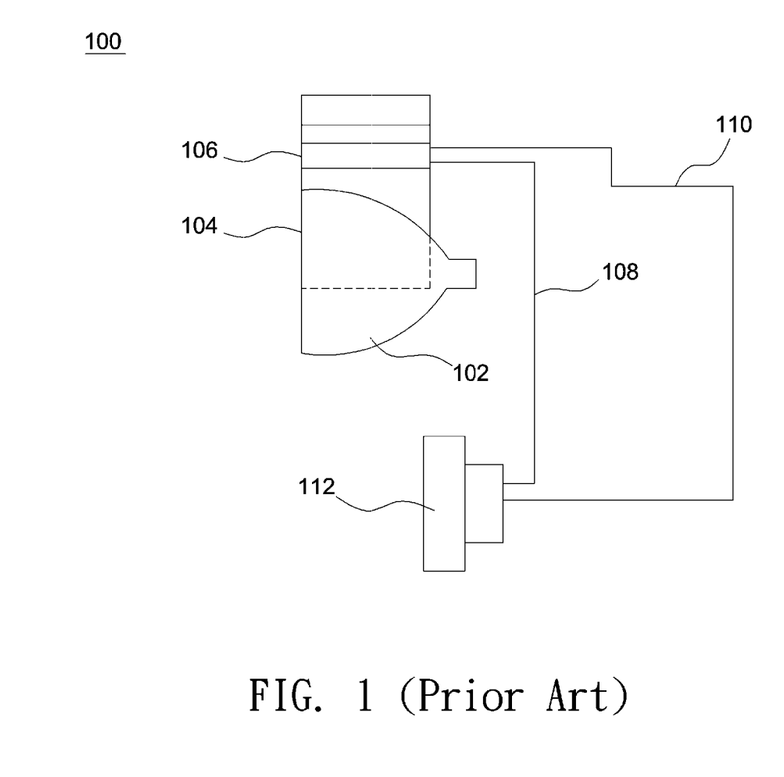
FIG. 1 shows a schematic diagram of a conventional thermoelectric generator.

Nowadays, the principle of converting heat into electricity is already developed. Technology of recycling and reusing the waste heat from electronic devices is widely used to achieve energy-efficient and environmental protection purposes. For example, as shown in FIG. 1, U.S. patent publication No. 2005/0000559 discloses a thermoelectric generator 100 including a light source 102, a heat absorption member 104, and a thermoelectric module 106. The thermoelectric module 106 has a top plate and a bottom plate, and a temperature difference exists between the top plate and the bottom plate is allowed to generate electricity that is output via leads 108 and 110 and used to, for example, cooling a display 112. Further, U.S. patent publication No. 2007/0289621A discloses an illumination system including an illumination unit, a heat conductive member, a thermoelectric conversion module, and a heat releasing path member. The thermoelectric conversion module includes lower and upper substrates, lower and upper electrodes, and thermoelectric elements. A bottom surface of the lower substrate of the thermoelectric conversion module is fixed to a top surface of the heat conductive member, and a top surface of the upper substrate is fixed to a bottom surface of the heat releasing path member.

However, according to the conventional designs, the electrical energy converted from recycling waste heat is directly transmitted to a energy-consuming device and thus fails to be managed or allocated to result in low utilization efficiency of electrical energy.

BRIEF SUMMARY OF THE INVENTION

The invention provides an optical projection system and an energy control method for the optical projection system.

In order to achieve one or a portion of or all of the objects or other objects, one embodiment of the invention provides an optical projection system including a light source module, an optical engine, a thermoelectric generator, a storage unit, a plurality of electronic devices, and a selection unit. The light source module is capable of emitting at least one light beam, and the optical engine receives the light beam and modulates the light beam according to at least one image signal to form an image beam. The thermoelectric generator absorbs heat in the optical projection system and converts the heat into electrical energy, and the storage unit stores the electrical energy. The electronic devices receive the electrical energy stored in the storage unit and have at least two different threshold voltages. The selection unit selectively turns on at least one of the electronic devices according to a state of charge of the storage unit.

In one embodiment, the storage unit includes a control IC and a rechargeable battery, the thermoelectric generator converts the heat into the electrical energy in the form of voltage or current, and the control IC boosts up the voltage or current and stores the electrical energy into the rechargeable battery.

In one embodiment, the thermoelectric generator is located near the light source module or the optical engine.

The light source module may include a green LED, a red LED and a blue LED, and the thermoelectric generator may be located near the green LED.

In one embodiment, the multiple electronic devices may include a cooling fan, a microcontroller, an uninterruptible power supply, and a direct-current charger. The microcontroller may use the electrical energy stored in the storage unit to display information about the state of charge or a power interrupt event. A threshold voltage of the cooling fan and the uninterruptible power supply is larger than a threshold voltage of the microcontroller, and a threshold voltage of the direct-current charger is larger than the threshold voltage of the microcontroller and smaller than the threshold voltage of the cooling fan.

In one embodiment, the thermoelectric generator is enabled when the optical projection system reaches a temperature of more than 50° C.

Another embodiment of the invention provides an energy control method for an optical projection system, where the optical projection system includes multiple electronic devices with at least two different threshold voltages or power consumption levels. The energy control method includes the steps of converting heat in the optical projection system into electrical energy and storing the electrical energy in a storage unit, and selectively turning on at least one of the electronic devices according to a state of charge of the storage unit.

In one embodiment, the step of selectively turning on at least one of the electronic devices may include shutting down at least one operating electronic device of the electronic devices according to the state of charge of the storage unit.

In one embodiment, the energy control method may further include displaying information about the state of charge or a power interrupt event through the electrical energy stored in the storage unit.

In one embodiment, the energy control method may further include using the electronic devices including a microcontroller, a cooling fan and a direct-current charger.

In one embodiment, the energy control method may further include using the electronic devices including an uninterruptible power supply.

In one embodiment, the energy control method may further include that the heat is converted into the electrical energy when the optical projection system reaches a temperature of more than 50° C.

According to the above embodiments, the storage unit may cooperate with the selection unit to open up possibilities of selectively turning on or off multiple electronic devices having different threshold voltages or different levels of power consumption. Therefore, compared with conventional designs, more efficient management and utilization of the electrical energy formed from thermoelectric conversion can be achieved. For example, in case the amount of recycled heat is so small as to generate insufficient electric charge, it is difficult for a conventional design to drive an electronic device such as a cooling fan. However, according to the above embodiment, such small amount of electric charge can be allocated for driving an electronic device with low threshold voltage or power consumption, such as a microcontroller, to display information about a state of charge or a power interrupt event. This allows for optimizing the utilization and allocation of the electrical energy formed from thermoelectric conversion.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 2:
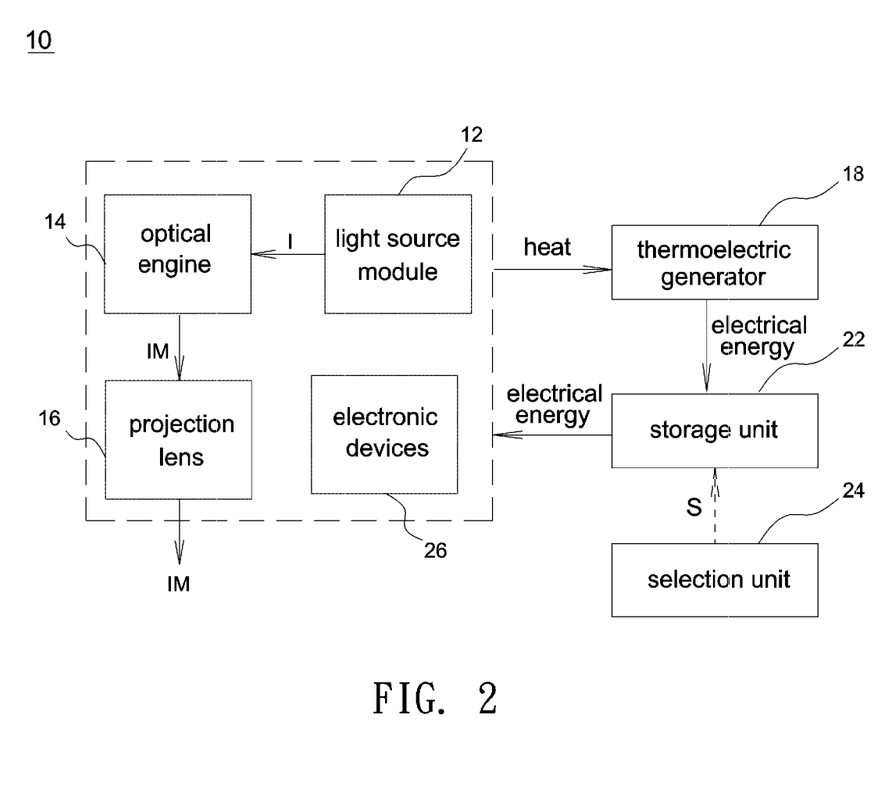
FIG. 2 shows a schematic block diagram of an optical projection system according to an embodiment of the invention.
Figure 3:
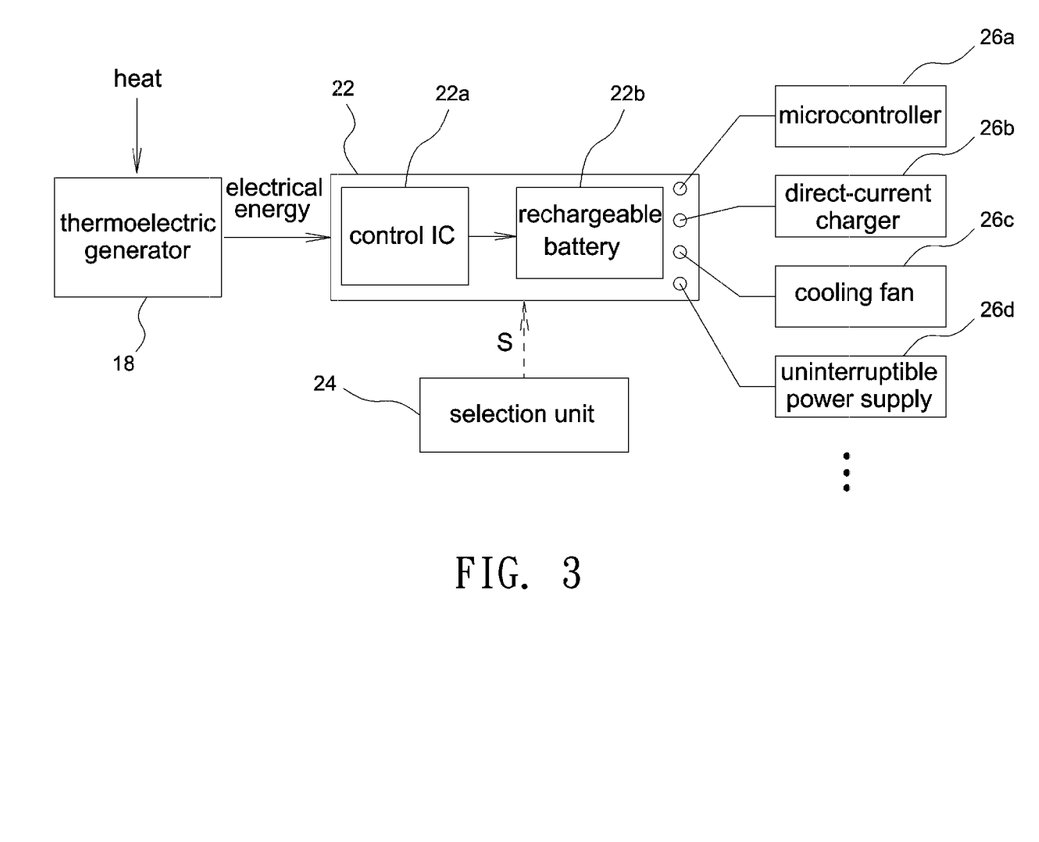
FIG. 3 shows a schematic block diagram illustrating the thermoelectric conversion and allocation of electrical energy according to an embodiment of the invention.

FIG. 2 shows a schematic block diagram of an optical projection system according to an embodiment of the invention. Referring to FIG. 2, an optical projection system 10 includes a light source module 12, an optical engine 14, a projection lens 16, a thermoelectric generator 18, a storage unit 22 and a selection unit 24. The light source module 12 emits at least one light beam I, and the optical engine 14 receives the light beam I and then modulates the light beam Ito form an image beam IM according to at least one image signal. The projection lens 16 receives and then projects the image beam IM. The thermoelectric generator 18 may absorb heat in the optical projection system 10 and convert the heat into electrical energy. Certainly, a heat source in the optical projection system 10 is not limited to a specific component. In one embodiment, heat in the optical projection system 10 may be mainly from the light source module 12 or the optical engine 14, and, in that case, the thermoelectric generator 18 may be located near the light source module 12 or the optical engine 14 to more efficiently absorb and convert the heat. Further, the optical projection system 10 may have multiple energy-consuming electronic devices 26 having at least two different threshold voltages. Please also refer to FIG. 3, these electronic devices 26 may include, for example, a microcontroller 26a, a direct-current (DC) charger 26b, a cooling fan 26c, an uninterruptible power supply (UPS) 26d, etc. The microcontroller 26a may provide a display panel of the optical projection system 10 with electrical energy stored in the storage unit 22 to display information about a state of charge or a power interrupt event. Alternatively, the state of charge may be shown by an on-screen-display (OSD). In one embodiment, the microcontroller 26a has a threshold voltage of 3-4 volts, the direct-current charger 26b has a threshold voltage of 4-5 volts, and the cooling fan 26c and the uninterruptible power supply 26d have a threshold voltage of 5 volt or more. As shown in FIG. 3, the storage unit 22 may include a control IC 22a and a rechargeable battery 22b. In one embodiment, the thermoelectric generator 18 is enabled to convert heat into electrical energy in the form of voltage or current when the optical projection system 10 reaches a temperature of more than 50° C. The control IC 22a boosts up the voltage or current and stores the electrical energy in the rechargeable battery 22b. According to an embodiment of the invention, the selection unit 24 may output a selection signal S to the storage unit 22 to selectively turn on one of the multiple electronic devices 26 according to a state of charge of the storage unit 22. For example, when the state of charge of the storage unit 22 is in a low level, the selection unit 24 may turn on an electronic device such as a microcontroller 26a with a comparatively low threshold voltage. In comparison, when the state of charge is in a high level, the selection unit 24 may turn on an electronic device such as a direct-current charger 26b with a comparatively high threshold voltage. Moreover, in case the current amount of charge in the storage unit 22 is still higher, the cooling fan 26c or the uninterruptible power supply 26d with a higher threshold voltage is allowed to be turned on. Besides, the selection unit 24 is allowed to shut down an operating electronic device 26 or turn on again an off electronic device 26 according to a state of charge of the storage unit 22 or an actual demand to achieve efficient energy management and allocation.

According to the above embodiments, the storage unit may cooperate with the selection unit to open up possibilities of selectively turning on or off multiple electronic devices having different threshold voltages or different levels of power consumption. Therefore, compared with conventional designs, more efficient management and utilization of the energy formed from thermoelectric conversion can be achieved. For example, in case the amount of recycled heat is so small as to generate insufficient electric charge, it is difficult for a conventional design to drive an electronic device such as a cooling fan. However, according to the above embodiment, such small amount of electric charge can be allocated for driving an electronic device with low threshold voltage or power consumption, such as a microcontroller, to display information about a state of charge or a power interrupt event. This allows for optimizing the utilization and allocation of the electrical energy formed from thermoelectric conversion.

Figure 4:
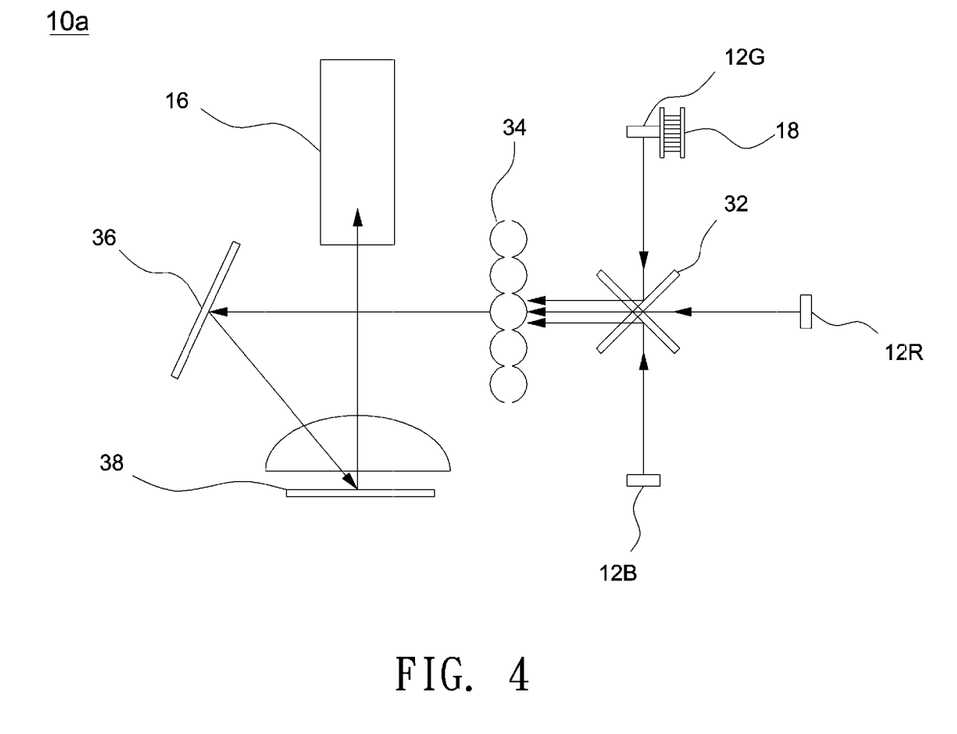
FIG. 4 shows a schematic diagram of an optical projection system according to an embodiment of the invention.

Further, the thermoelectric generator 18 may be located in any desired position of the optical projection system. For example, as shown in FIG. 4, in an optical projection system 10*a*, the light source module 12 may include a green LED 12G, a red LED 12R and a blue LED 12B, and light beams combined by a light-mixing device 32 pass through a light-homogenizing device 34 and are reflected by a reflective element 36 and a digital micro-mirror device 38. The digital micro-mirror device 38 modulates the light beams reflected by the reflective element 36, and the modulated light beams are projected by a projection lens 16. In this embodiment, the thermoelectric generator 18 may be, but not limited to, located near the green LED 12G having comparatively high heat emission. Certainly, the thermoelectric generator 18 may be located in other position according to actual demands. In an alternate embodiment, the LED of the light source module 12 may be replaced with a laser diode.

Figure 5:
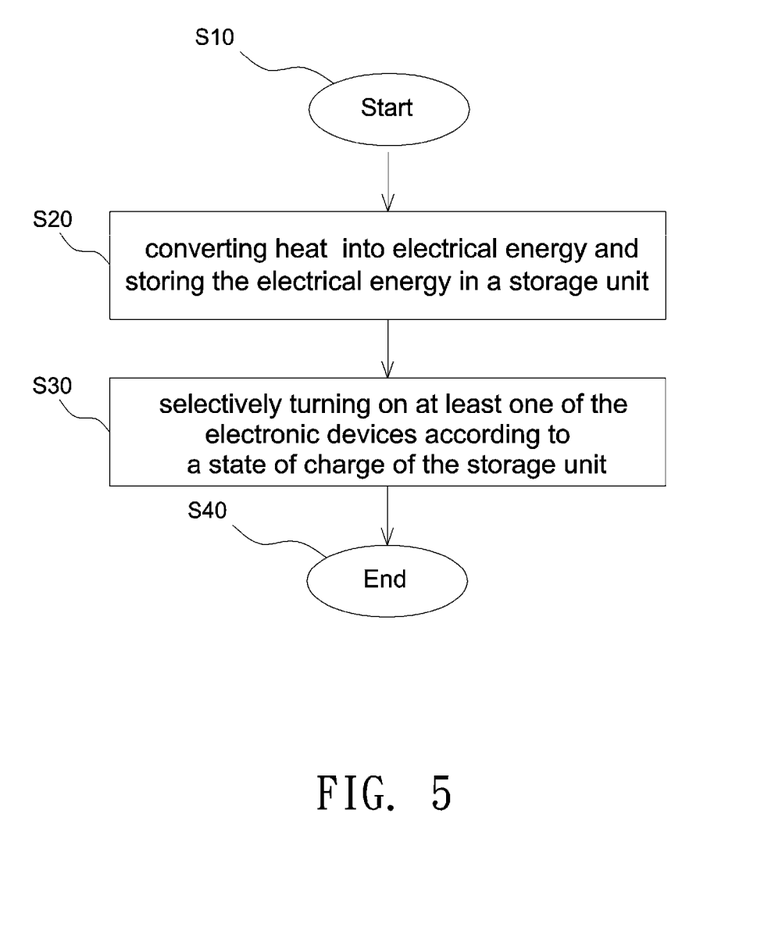
FIG. 5 is a flowchart showing an energy control method for an optical projection system according to an embodiment of the invention.

FIG. 5 is a flowchart showing an energy control method for an optical projection system according to an embodiment of the invention. The optical projection system, as described in the above embodiments, may include multiple electronic devices having different threshold voltages or different levels of power consumption. As shown in FIG. 5, first, heat in an optical projection system is converted into electrical energy and stored in a storage unit (step S20), and at least one of the electronic devices is selectively turned on according to a state of charge of the storage unit (step S30). Note the step of selectively turning on at least one of the electronic devices may include directly turning on an off electronic device, shutting down an operating electronic device, or turning on again an off electronic device 26 according to the state of charge of the storage unit. These electronic devices may include, but not limited to, a microcontroller, a cooling fan, a direct-current charger and an uninterruptible power supply.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims.

What is claimed is:

1. An optical projection system, comprising:
   a light source module capable of emitting at least one light beam;
   an optical engine for receiving the light beam and modulating the light beam according to at least one image signal to form an image beam;
   a thermoelectric generator for absorbing heat in the optical projection system and converting the heat into electrical energy;
   a storage unit for storing the electrical energy, wherein a state of charge of the storage unit is allowed to reach at least a first level or a second level, and the second level is larger than the first level;
   a first electronic device and a second electronic device for receiving the electrical energy stored in the storage unit, wherein the first electronic device has a first threshold voltage, the second electronic device has a second threshold voltage, the first threshold voltage is a minimum voltage required to make the first electronic device operable, the second threshold voltage is a minimum voltage required to make the second electronic device operable, and the second threshold voltage is larger than the first threshold voltage; and
   a selection unit, wherein the selection unit outputs a first selection signal to the storage unit to turn on the first electronic device having the first threshold voltage when the state of charge of the storage unit reaches the first level and turn on the second electronic device having the second threshold voltage when the state of charge of the storage unit reaches the second level, and the selection unit outputs a second selection signal to the storage unit to selectively shut down at least one of the first electronic device and the second electronic device according to (1) the state of charge of the storage unit and (2) the first threshold voltage of the first electronic device and the second threshold voltage of the second electronic device, wherein the second electronic device with the second threshold voltage is set by the selection unit to have higher priority to be shut down over the first electronic device with the first threshold voltage when the first electronic device and the second electronic device are in an operating state simultaneously.

2. The optical projection system as claimed in claim 1, wherein the storage unit includes a control IC and a rechargeable battery, the thermoelectric generator converts the heat into the electrical energy in the form of voltage or current, and the control IC boosts up the voltage or current and stores the electrical energy into the rechargeable battery.

3. The optical projection system as claimed in claim 1, wherein the thermoelectric generator is located near the light source module or the optical engine.

4. The optical projection system as claimed in claim 1, wherein the light source module comprises a green LED, a red LED and a blue LED, and the thermoelectric generator is located near the green LED.

5. The optical projection system as claimed in claim 1, wherein the second electronic device is a cooling fan and the first electronic device is a microcontroller.

6. The optical projection system as claimed in claim1, wherein the second electronic device is an uninterruptible power supply and the first electronic device is a microcontroller.

7. The optical projection system as claimed in claim1, wherein the second electronic device is a direct-current charger and the first electronic device is a microcontroller.

8. The optical projection system as claimed in claim 1, wherein the thermoelectric generator is enabled when the optical projection system reaches a temperature of more than 50° C.

9. The optical projection system as claimed in claim 1, wherein the first electronic device is a microcontroller, and the microcontroller is configured to provide information about the state of charge of the storage unit to be displayed by the optical projection system.

10. The optical projection system as claimed in claim 9, wherein the optical projection system further comprises a projection lens, and the state of charge of the storage unit provided by the microprocessor is adapted to be projected on an on-screen-display by the projection lens.

11. The optical projection system as claimed in claim 9, wherein the optical projection system further comprises a display panel, and the state of charge of the storage unit provided by the microprocessor is adapted to be displayed on the display panel.

12. An energy control method for an optical projection system, the optical projection system comprising a first electronic device and a second electronic device for receiving the electrical energy stored in the storage unit, wherein the first electronic device has a first threshold voltage, the second electronic device has a second threshold voltage, the first threshold voltage is a minimum voltage required to make the first electronic device operable, the second threshold voltage is a minimum voltage required to make the second electronic device operable, the second threshold voltage is larger than the first threshold voltage, and the energy control method comprising the steps of:

converting heat in the optical projection system into electrical energy and storing the electrical energy in a storage unit, wherein a state of charge of the storage unit is allowed to reach at least a first level or a second level, and the second level is larger than the first level; and turning on the first electronic device having the first threshold voltage when the state of charge of the storage unit reaches the first level, turning on the second electronic device having the second threshold voltage when the state of charge of the storage unit reaches the second level, and selectively shutting down at least one of the first electronic device and the second electronic device according to (1) the state of charge of the storage unit and (2) the first threshold voltage of the first electronic device and the second threshold voltage of the second electronic device, wherein the second electronic device with the second threshold voltage is set by the selection unit to have higher priority to be shut down over the first electronic device with the first threshold voltage when the first electronic device and the second electronic device are in an operating state simultaneously.

13. The energy control method as clamed in claim 12, wherein the first electronic device is a microcontroller, and the microcontroller is configured to provide information about the state of charge of the storage unit to be displayed by the optical projection system.

14. The energy control method as clamed in claim 12, wherein the second electronic device is a cooling fan or a direct-current charger, and the first electronic device is a microcontroller.

15. The energy control method as clamed in claim 12, wherein the second electronic device is an uninterruptible power supply, and the first electronic device is a microcontroller.

16. The energy control method as clamed in claim 12, wherein the heat is converted into the electrical energy when the optical projection system reaches a temperature of more than 50° C.

* * * * *